US011329143B2

(12) United States Patent
Cheng et al.

(10) Patent No.: US 11,329,143 B2
(45) Date of Patent: May 10, 2022

(54) NANOSHEET TRANSISTORS WITH THIN INNER SPACERS AND TIGHT PITCH GATE

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 16/732,757

(22) Filed: Jan. 2, 2020

(65) Prior Publication Data

US 2020/0144396 A1    May 7, 2020

Related U.S. Application Data

(62) Division of application No. 15/852,111, filed on Dec. 22, 2017, now Pat. No. 10,600,889.

(51) Int. Cl.
*H01L 29/66* (2006.01)
*H01L 29/423* (2006.01)
(Continued)

(52) U.S. Cl.
CPC .... *H01L 29/66742* (2013.01); *H01L 29/0673* (2013.01); *H01L 29/42392* (2013.01);
(Continued)

(58) Field of Classification Search
CPC .......... H01L 29/66742; H01L 29/0673; H01L 29/42392; H01L 29/66545;
(Continued)

(56) References Cited

U.S. PATENT DOCUMENTS 8,293,608 B2    10/2012 Orlowski et al.
8,778,768 B1    7/2014 Chang et al.
(Continued)

OTHER PUBLICATIONS

List of IBM Patents or Patent Applications Treated as Related.

*Primary Examiner* — Tong-Ho Kim
(74) *Attorney, Agent, or Firm* — Randall Bluestone; Ryan, Mason & Lewis, LLP (57) ABSTRACT

A semiconductor structure is provided which includes a nanosheet stack structure on a base. The nanosheet stack structure includes a multilayered nanosheet between adjacent nanosheet layers. The multilayered nanosheet includes one or more first layers of a first material and one or more second layers of a second material, wherein the first material has an etch selectivity different than the second material. The one or more first layers of the multilayered nanosheet are recessed. A first inner spacer includes a third material is formed by depositing the third material into an outer portion of the one or more recessed first layers of the multilayered nanosheet. The one or more second layers of the multilayered nanosheet are recessed. A second inner spacer includes a fourth material which is formed by depositing the fourth material into an outer portion of the one or more recessed second layers of the first multilayered nanosheet.

20 Claims, 7 Drawing Sheets

(51) Int. Cl.
  *H01L 29/06* (2006.01)
  *H01L 29/786* (2006.01)
  *H01L 29/775* (2006.01)

(52) U.S. Cl.
  CPC .. *H01L 29/66545* (2013.01); *H01L 29/66553* (2013.01); *H01L 29/66795* (2013.01); *H01L 29/775* (2013.01); *H01L 29/78618* (2013.01); *H01L 29/78696* (2013.01)

(58) Field of Classification Search
  CPC ......... H01L 29/66553; H01L 29/66795; H01L 29/775; H01L 29/78618; H01L 29/78696; H01L 29/0653; H01L 29/401; H01L 29/66439; H01L 29/78684; B82Y 10/00
  USPC ....................................................... 257/382
  See application file for complete search history.

(56) References Cited

U.S. PATENT DOCUMENTS

| | | | |
|---|---|---|---|
| 9,287,357 B2 | 3/2016 | Rodder et al. | |
| 9,306,019 B2 | 4/2016 | Wan et al. | |
| 9,484,447 B2 | 11/2016 | Kim et al. | |
| 9,570,609 B2 | 2/2017 | Obradovic et al. | |
| 9,595,449 B1 | 3/2017 | Jagannathan et al. | |
| 9,653,585 B2 | 5/2017 | Zhang | |
| 9,660,028 B1 | 5/2017 | Cheng et al. | |
| 9,741,823 B1 | 8/2017 | Greene et al. | |
| 9,748,382 B1 | 8/2017 | Gluschenkov et al. | |
| 9,773,875 B1 | 9/2017 | Jagannathan et al. | |
| 9,773,886 B1 | 9/2017 | Palle et al. | |
| 9,799,748 B1 | 10/2017 | Xie et al. | |
| 9,842,914 B1 | 12/2017 | Yeung et al. | |
| 10,374,067 B2 | 8/2019 | Levy et al. | |
| 10,388,729 B2 | 8/2019 | Zhang et al. | |
| 10,403,738 B1 | 9/2019 | Sung et al. | |
| 10,403,739 B2 | 9/2019 | Kim et al. | |
| 2007/0040263 A1 | 2/2007 | Towada | |
| 2008/0135949 A1 | 6/2008 | Lo et al. | |
| 2015/0099368 A1 | 4/2015 | Shen et al. | |
| 2015/0295084 A1 | 10/2015 | Obradovic et al. | |
| 2016/0071729 A1 | 3/2016 | Hatcher et al. | |
| 2017/0040455 A1 | 2/2017 | Kittl et al. | |
| 2017/0069481 A1 | 3/2017 | Doris et al. | |
| 2017/0213911 A1 | 7/2017 | Balakrishnan et al. | |
| 2017/0221708 A1 | 8/2017 | Bergendahl et al. | |
| 2017/0221992 A1 | 8/2017 | Chang et al. | |
| 2017/0263705 A1 | 9/2017 | Cheng et al. | |
| 2017/0317169 A1 | 11/2017 | Bentley et al. | |
| 2017/0330934 A1 | 11/2017 | Zhang et al. | |
| 2017/0358665 A1* | 12/2017 | Song | H01L 29/6656 |
| 2018/0204931 A1 | 7/2018 | Reboh et al. | |
| 2018/0294331 A1 | 10/2018 | Cho et al. | |
| 2019/0081155 A1 | 3/2019 | Xie et al. | |
| 2019/0296128 A1 | 9/2019 | Smith et al. | |
| 2019/0319095 A1 | 10/2019 | Zhang et al. | |

* cited by examiner

NANOSHEET TRANSISTORS WITH THIN INNER SPACERS AND TIGHT PITCH GATE

BACKGROUND

The present application generally relates to semiconductor fabrication techniques and, in particular, techniques for fabricating nanosheet transistor devices.

Continued innovations in semiconductor process technologies are enabling higher integration densities and device scaling. As the semiconductor industry moves towards the 7 nanometer (nm) technology node and beyond, planar and non-planar semiconductor device structures, such as field-effect transistors (FETs) (e.g., metal-oxide-semiconductor FETs (MOSFETs)), must be scaled to smaller dimensions to provide increased device width per footprint area. In this regard, nanosheet (or nanowire) FET devices are considered to be a viable option for continued scaling. In general, a nanosheet FET device comprises a device channel having a nanosheet stack comprising one or more nanosheet layers, with each nanosheet layer having a vertical thickness that is substantially less than the width of the nanosheet layer. A common gate structure may be formed above and below each nanosheet layer in a stacked configuration, thereby increasing the FET device width (or channel width). Accordingly, such nanosheet FET devices may increase the drive current for a given footprint area.

SUMMARY

Embodiments described herein provide methods of forming semiconductor devices.

For example, one exemplary embodiment includes a method for fabricating a semiconductor device. The method comprises forming a nanosheet stack structure on a semiconductor substrate, wherein the nanosheet stack structure comprises a multilayered nanosheet between adjacent nanosheet layers, and further wherein the multilayered nanosheet comprises one or more first layers of a first material and one or more second layers of a second material, wherein the first material has an etch selectivity different than the second material. The method further comprises recessing the one or more first layers of the multilayered nanosheet. The method further comprises forming a first inner spacer comprising a third material, wherein forming the first inner spacer comprises depositing the third material into an outer portion of the one or more recessed first layers of the multilayered nanosheet. The method further comprises recessing the second layer of the multilayered nanosheet. The method further comprises forming a second inner spacer comprising a fourth material, wherein forming the second inner spacer comprises depositing the fourth material into an outer portion of the one or more recessed second layers of the first multilayered nanosheet.

Another exemplary embodiment includes a semiconductor device which comprises a nanosheet stack structure formed on a base. The nanosheet stack structure comprises a multilayered nanosheet between adjacent nanosheet layers. The multilayered nanosheet comprises one or more first layers of a first material and one or more second layers of a second material, wherein the first material has an etch selectivity different from the second material. The one or more first layers of the multilayered nanosheet further comprise outer portions comprised of a third material. The one or more second layers of the multilayered nanosheet further comprise outer portions comprised of a further material. The outer portions are inner spacers.

These and other features, objects and advantages of the present invention will become apparent from the following detailed description of illustrative embodiments thereof, which is to be read in connection with the accompanying drawings.

DETAILED DESCRIPTION

In illustrative embodiments, techniques are provided for fabricating semiconductor devices comprised of one or more FETs. More particularly, illustrative embodiments provide techniques for fabricating semiconductor devices comprised of one or more nanosheet FETS (e.g., nanosheet MOSFETS). As will be explained in illustrative embodiments, such fabrication techniques advantageously improve the fabrication of semiconductor devices.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. In addition, in the figures, the illustrated scale of one layer, structure, and/or region relative to another layer, structure, and/or region is not necessarily intended to represent actual scale.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "III-V compound" refers to a compound formed by combining one or more group III elements (i.e., one or more elements from the boron group or group 13) with one or more group V elements (i.e., one or more elements from the pnictogen group or group 15).

Figure 1A:
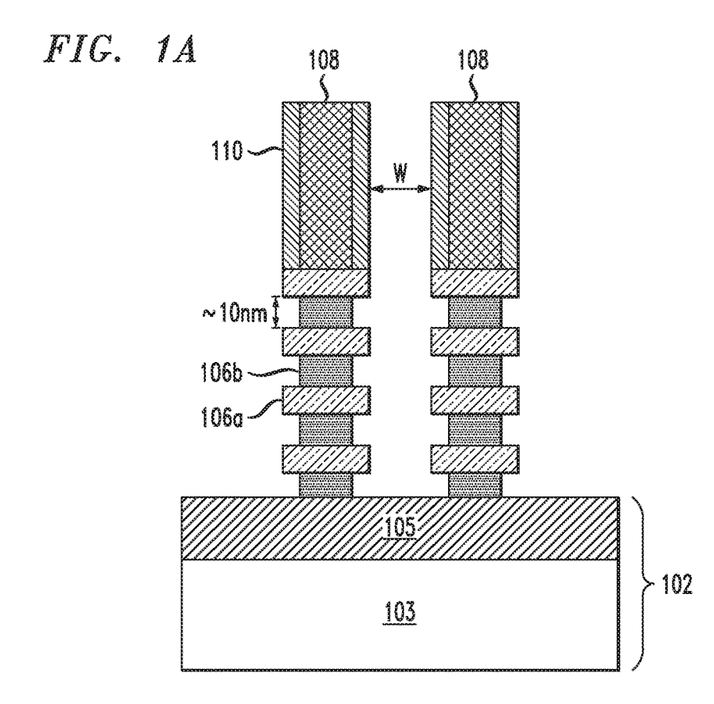
FIG. 1A is a schematic perspective view of a portion of a semiconductor device.

Inner spacers may be formed during semiconductor structure (e.g., FET) fabrication to provide source/drain (S/D) isolation, and to reduce parasitic capacitances. Conventional methods for forming inner spacers are complex and impose constraints on gate pitch scaling, which also imposes constraints on the maximum space between nanosheets for gate formation. For example, as illustrated in FIG. 1A, in a conventional nanosheet process flow, the inner spacer can be formed by the following process steps: (a) recessing nanosheet stack having a single SiGe sacrificial layer 106b in between the nanosheets 106a to expose nanosheet ends on base 102 having a buffer 105 on substrate 103 after forming a dummy gate 108 and cladding spacer 110; (b) undercutting the sacrificial SiGe layer 106b between adjacent Si nanosheets 106a to create an indent; (c) conformally depositing a dielectric to fill the indent (not shown); and (d) isotropically etching back the dielectric to remove the dielectric to expose Si nanosheet ends so that epitaxy can be performed to form source/drain (not shown).

Figure 1B:
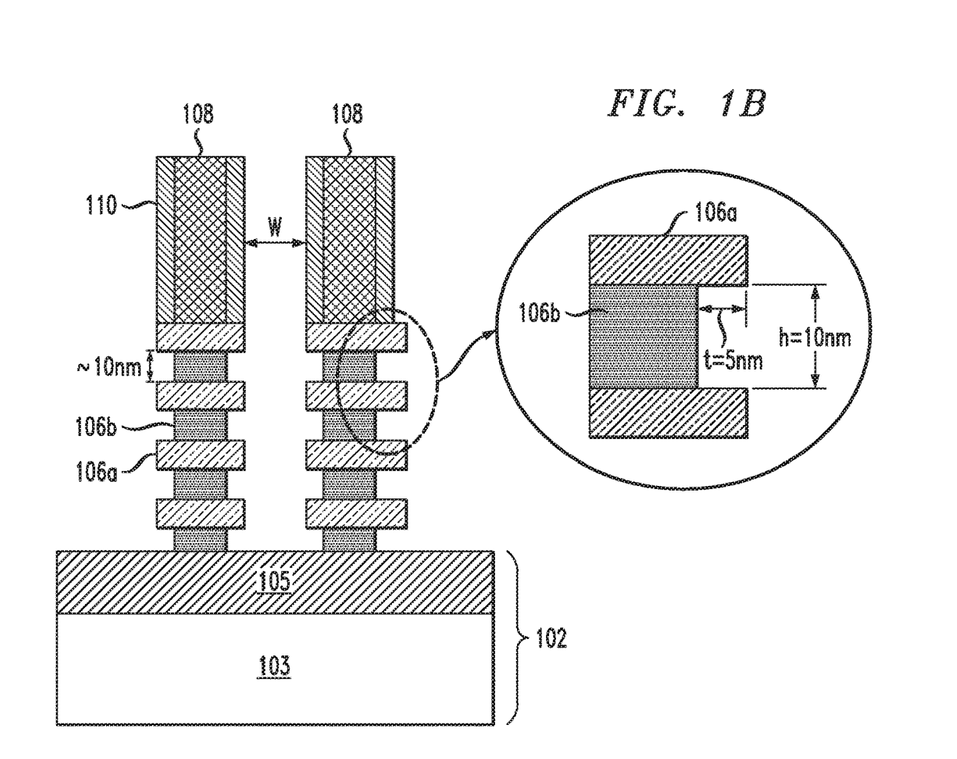
FIG. 1B is a schematic perspective view of a portion of a semiconductor device.

The conventional approach described above has two issues. First, the indent is typically about 10 nm wide, so it requires at least 5 nm dielectric deposition to pinch off the 10 nm gap. With a small gate pitch, the spacing before the dielectric deposition between adjacent gates may already be very small. Therefore, the dielectric deposition may pinch off the spacing between adjacent gates. Once this happens, it is very difficult to etchback the dielectric while keeping the dielectric in the indent between adjacent nanosheets. Second, complementary metal oxide semiconductor (CMOS) scaling requires shrinking the inner spacer thickness, for example, to 5 nm. As exemplified in FIG. 1B, the indent is typically about 10 nm wide vertically and 5 nm wide laterally. In such a case, it can be difficult to use the deposition/etch back (so-call "divot-fill" approach) to reliably form the inner spacer. Accordingly, there is a need for an improved process to form nanosheet transistors with thin spacer and highly scaled gate pitch.

The embodiments described herein therefore provide for fabrication techniques that advantageously form inner spacers for semiconductor structures with less complex processing while substantially limiting the constraints on gate pitch scaling associated with the conventional methods of inner spacer formation.

An illustrative embodiment for forming a semiconductor device will be described below with reference to FIGS. 2-12D. Note that the same reference numeral (100) is used to denote the semiconductor structure through the various intermediate fabrication stages illustrated in FIGS. 2 through 12D. Note also that semiconductor structure described herein can also be considered to be a semiconductor device and/or an integrated circuit, or some part thereof.

Figure 2:
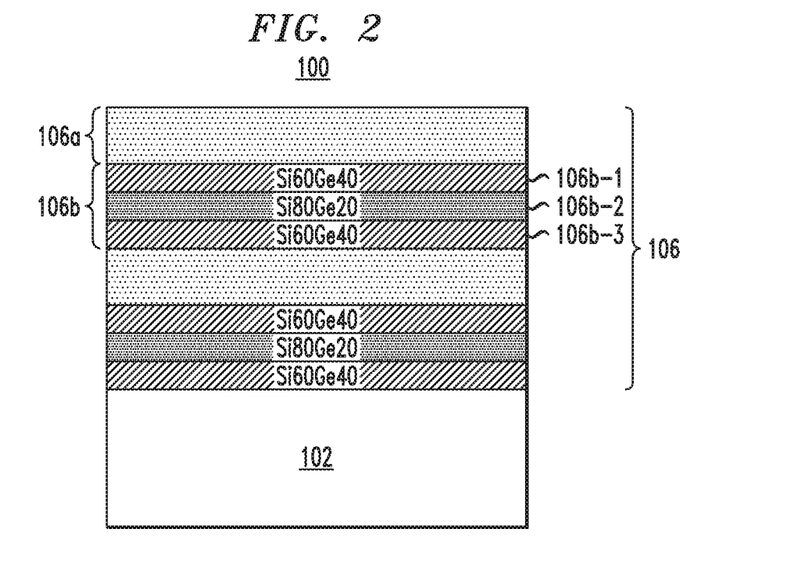
FIG. 2 is a cross-sectional view of a portion of a semiconductor device at a first-intermediate fabrication stage, according to an illustrative embodiment.

FIG. 2 illustrates a view of a semiconductor structure at a first-intermediate fabrication stage. For the purpose of clarity, several fabrication steps leading up to the production of the semiconductor structure as illustrated in FIG. 2 are omitted. In other words, the semiconductor structure does not necessarily start out in the form illustrated in FIG. 2, but may develop into the illustrated structure over one or more well-known processing steps which are not illustrated but are well-known to those of ordinary skill in the art.

FIG. 2 illustrates a cross-sectional view of semiconductor structure 100 at the first-intermediate fabrication stage. Semiconductor structure 100 in FIG. 2 is shown comprising nanosheet stack 106 formed on base 102. Base 102 illustratively comprises a semiconductor substrate and an optional buffer layer (not shown). In one embodiment, the semiconductor substrate is comprised of silicon (Si). In another embodiment, the semiconductor substrate is comprised of a III-V compound or II-V compound. However, the semiconductor substrate may be comprised of any material suitable for use in accordance with the embodiments described herein. In one embodiment, the optional buffer is comprised of a III-V compound (e.g., alloy). For example, optional buffer may be comprised of gallium arsenide phosphide ($GaAs_{1-x}P_x$). However, optional buffer may be comprised of any material suitable for use in accordance with the embodiments described herein Nanosheet stack 106 is comprised of alternating nanosheet layers. For example, as shown in FIG. 2, nanosheet stack 106 comprises a nanosheet layer 106a comprising a first material and multilayered nanosheet 106b each comprising another material. In general, the nanosheet stack structure comprises multilayered nanosheet 106b between adjacent nanosheet layers 106a, and further wherein multilayered nanosheet 106b comprises one or more first layers of a first material and one or more second layers of a second material, wherein the first material has an etch selectivity different than the second material as discussed below. Each nanosheet layer of nanosheet stack 106 may have a thickness ranging from about 1 nm to about 100 nm.

The nanosheet stack 106 can be formed by epitaxially growing the nanosheet stack with the multilayered nanosheet 106b between adjacent nanosheet layers 106a. In one embodiment, nanosheet layer 106a is comprised of silicon. In another embodiment, multilayered nanosheet 106b can be comprised of alternating layers of $Si_xGe_y$. In another embodiment, nanosheet layer 106a can be silicon (Si), and multilayered nanosheet 106b can independently be a low Ge % layer surrounded by two high Ge % layers, e.g., $Si_{60}Ge_{40}/Si_{80}Ge_{20}/Si_{60}Ge_{40}$; or a high Ge % layer surrounded by two low Ge % layers, e.g., $Si_{80}Ge_{20}/Si_{60}Ge_{40}/Si_{80}Ge_{20}$; or SiGe surrounded by carbon-doped SiGe; or boron-doped SiGe surrounded by undoped SiGe; or undoped SiGe surrounded by boron-doped SiGe; or any other suitable multilayered material structure. Although two different materials are shown in the multilayered nanosheet 106b, it is contemplated that there can be more than two different materials in multilayered nanosheet 106b, for example, three layers of SiGe with different Ge %.

In one embodiment, multilayered nanosheet 106b can comprise two or more layers. In one embodiment, multilayered nanosheet 106b can comprise three or more layers. In another embodiment, multilayered nanosheet 106b can comprise four or more layers. For example, as further shown in FIG. 2, multilayered nanosheet 106b can independently comprise three alternating layers, e.g., layer 106b-1, layer 106b-2 and layer 106b-3, such as $Si_{60}Ge_{40}/Si_{80}Ge_{20}/Si_{60}Ge_{40}$. It is to be understood that the arrangement of nanosheet stack 106, including the number of alternating nanosheet layers of nanosheet stack 106, is purely exemplary and should not be considered limiting. Nanosheet stack 106 may be used to form a fin of a resulting nanosheet FET. In general, non-limiting range for each alternating layer of multilayered nanosheet 106b can have a height of about 8 nm to about 20 nm and a width of about 10 nm to about 50 nm, where the "width" refers to fin width in the in-out paper direction, i.e., fin width.

Figure 3:
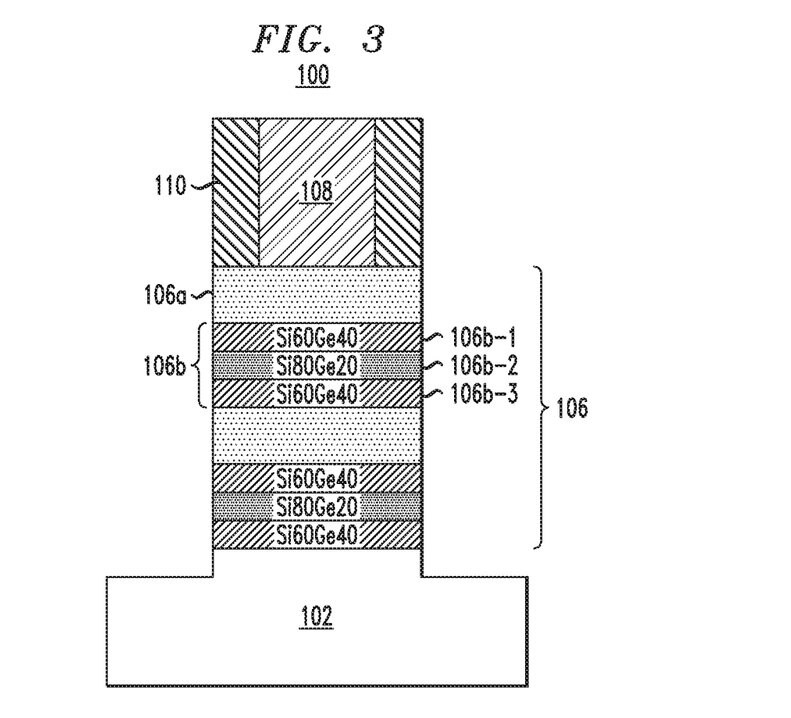
FIG. 3 is a schematic cross-sectional view of a portion of a semiconductor device at a second-intermediate fabrication stage, according to an illustrative embodiment.

FIG. 3 illustrates a cross-sectional view of semiconductor structure 100 at a second-intermediate fabrication stage. During this stage, cladding spacer 110 and dummy gate 108 are formed around nanosheet stack 106 and on base 102. After the cladding spacer 110 and dummy gate 108 are formed around nanosheet stack 106, base 102 is then recessed for forming the source/drain regions. For example, base 102 may be recessed using reactive ion etching (ME). However, base 102 may be recessed using any process suitable for use in accordance with the embodiments described herein.

Figure 4:
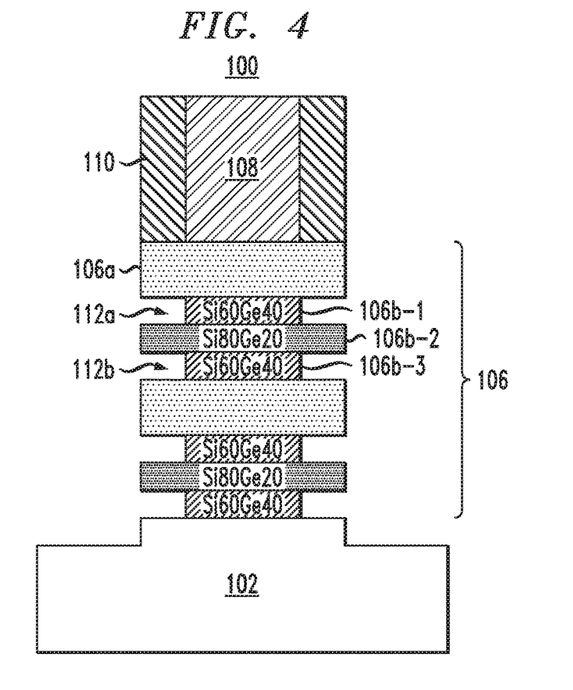
FIG. 4 is a schematic perspective view of a portion of a semiconductor device at a third-intermediate fabrication stage, according to an illustrative embodiment.

FIG. 4 illustrates a cross-sectional view of semiconductor structure 100 at a third-intermediate fabrication stage. During this stage, top layer 106b-1 and bottom layer 106b-3 of multilayered nanosheet 106b are laterally etched to form a first divot 112a between the layer 106b-2 and nanosheet layer 106a, and a second divot 112b between the layer 106b-2 and base 102. The lateral etching of layers 106b-1 and 106b-3 may be performed using, for example, an isotropic etch such as gas phase etch, plasm etch, or wet etch. For example, in the case where the multilayered sacrificial layer 106b comprise $Si_{60}Ge_{40}/Si_{80}Ge_{20}/Si_{60}Ge_{40}$ layers, the lateral etch selectively removes a portion of the high Ge % (i.e., $Si_{60}Ge_{40}$) sacrificial layers relative to the low Ge % (i.e., $Si_{80}Ge_{20}$) sacrificial layer, nanosheets 106a and base 102 to form divots 112a and 112b. The etch process for the case of SiGe can be, for example, gas phase hydrogen fluoride etch, a wet etch process containing a mix of ammonia and hydrogen peroxide, or a dry etch such as plasma etch. In general, the etching to form the divots can be, for example, a vertical etching of about 3 nm (i.e., a 3 nm width) and a lateral etching of about 5 nm.

Figure 5:
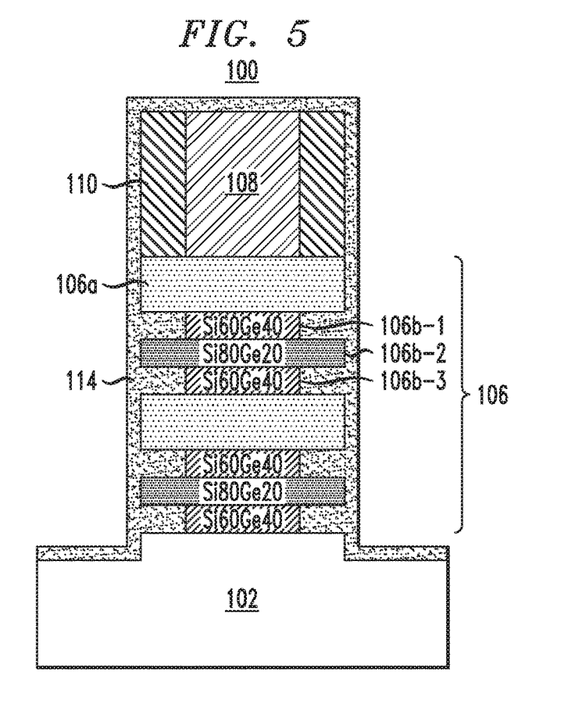
FIG. 5 is a schematic cross-sectional view of a portion of a semiconductor device at a fourth-intermediate fabrication stage, according to an illustrative embodiment.

FIG. 5 illustrates a cross-sectional view of semiconductor structure 100 at a fourth-intermediate fabrication stage. During this stage, a thin dielectric layer 114 is deposited on base 102 and over cladding spacer 110 and dummy gate 108 and filling divots 112a and 112b. Dielectric layer 114 can be, for example, silicon nitride, silicon oxide, silicon dioxide, silicon oxynitride, SiCN, SiOCN, SiOC, SiBCN, a dielectric metal oxide, a dielectric metal nitride, or a combination thereof. In one embodiment, the dielectric material is silicon nitride. The dielectric layer 114 can be deposited using a deposition process, such as chemical vapor deposition (CVD), atomic layer deposition (ALD), plasma enhanced chemical vapor deposition (PECVD), metal organic chemical vapor deposition (MOCVD) or other like chemical vapor deposition processes. In one embodiment, dielectric layer 114 can be deposited such that it is 2 nm from the exterior surface of cladding spacer 110 and nanosheet 106a to pinch off the divot, e.g., when the divot has a 3 nm width as discussed above.

Figure 6:
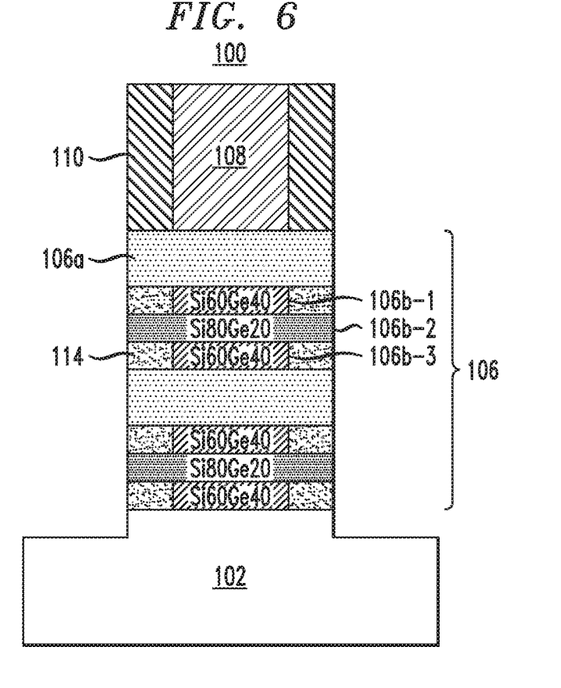
FIG. 6 is a schematic cross-sectional view of a portion of a semiconductor device at a fifth-intermediate fabrication stage, according to an illustrative embodiment.

FIG. 6 illustrates a cross-sectional view of semiconductor structure 100 at a fifth-intermediate fabrication stage. During this stage, dielectric layer 114 is selectively etched by an etch back process to remove the dielectric layer from the exterior surface of semiconductor 100 while leaving dielectric layer 114 in the space defined by divots 112a and 112b. In this exemplary embodiment, dielectric layer 114 is etched back to the level of the exterior surface of cladding spacer 110 and nanosheet 106a by, for example, an anisotropic etching process such as plasma etch or wet etching.

Figure 7:
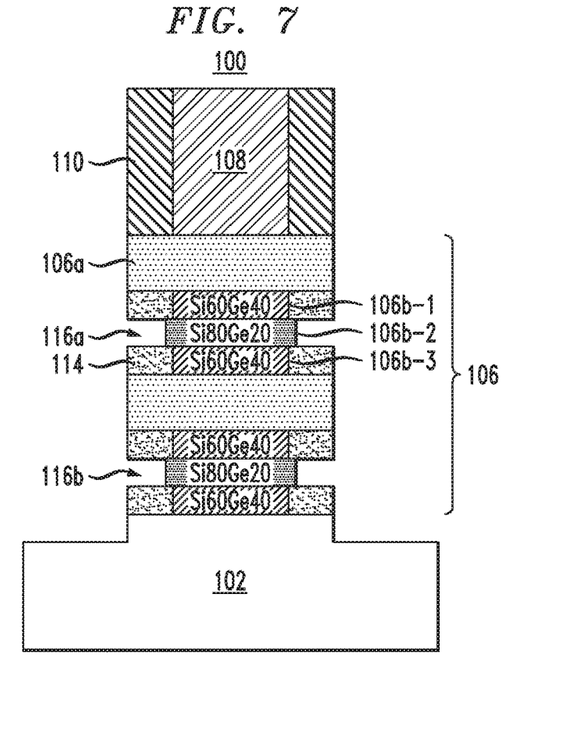
FIG. 7 is a schematic cross-sectional view of a portion of a semiconductor device at a sixth-intermediate fabrication stage, according to an illustrative embodiment.

FIG. 7 illustrates a cross-sectional view of semiconductor structure 100 at a sixth-intermediate fabrication stage. During this stage, layer 106b-2 of multilayered nanosheet 106b is laterally etched to form a divot 116a and 116b between the top layer 106b-1 and bottom layer 106b-3 of multilayered nanosheet 106b. The lateral etching of multilayered sacrificial layer 106b-2 may be performed using an isotropic etch such as gas phase etch, plasm etch, or wet etch. For example, in the case where the multilayered sacrificial layers 106b comprise $Si_{60}Ge_{40}/Si_{80}Ge_{20}/Si_{60}Ge_{40}$ layers, the lateral etch selectively removes the low Ge % (i.e., $Si_{80}Ge_{20}$) sacrificial layer relative to dielectric layer 114 and nanosheets 106a to form divots 116a and 116b. The etch process for the case of SiGe can be, for example, gas phase hydrogen fluoride etch, a wet etch process containing a mix of ammonia and hydrogen peroxide, or a dry etch such as plasma etch. In general, the etching to form the divot can be, for example, a vertical etching of about 3 nm (i.e., a 3 nm width) and a lateral etching of about 5 nm.

Figure 8:
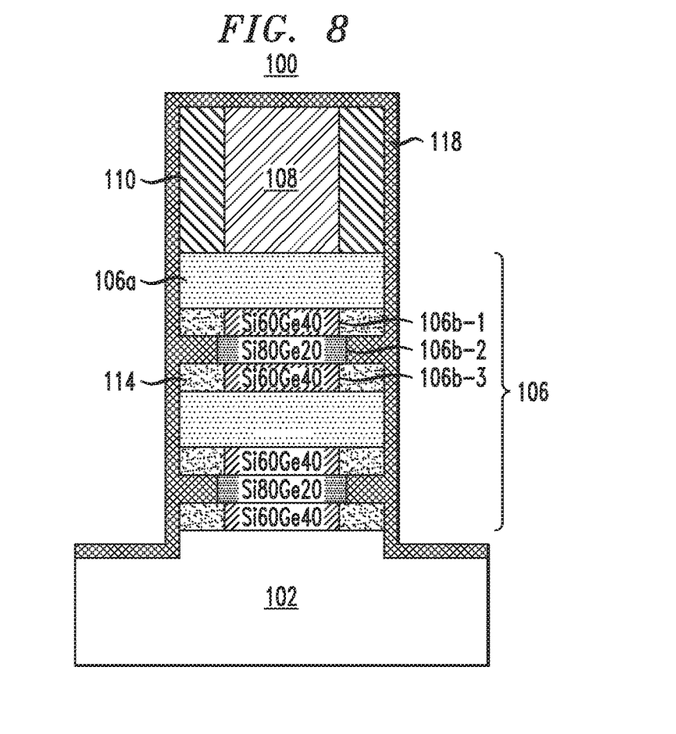
FIG. 8 is a schematic cross-sectional view of a portion of a semiconductor device at a seventh-intermediate fabrication stage, according to an illustrative embodiment.

FIG. 8 illustrates a cross-sectional view of semiconductor structure 100 at a seventh-intermediate fabrication stage. During this stage, a second thin dielectric layer 118 is deposited on base 102 and over cladding spacer 110 and dummy gate 108 and filling divots 116a and 116b. Dielectric layer 118 can be, for example, any of the dielectric material discussed above for dielectric layer 114. The dielectric layer 118 can be deposited using a deposition process as discussed above for dielectric layer 114. In one embodiment, dielectric layer 118 can be deposited such that it is 2 nm from the exterior surface of cladding spacer 110 and nanosheet 106a to pinch off the divot, e.g., when the divot has a 3 nm width as discussed above. The dielectric layer 118 and the dielectric layer 114 have the same material or different materials.

Figure 9:
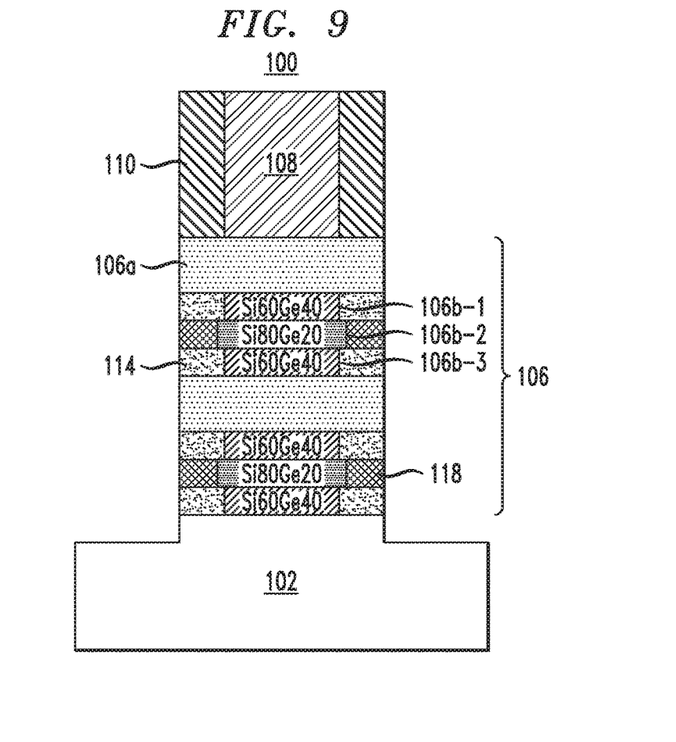
FIG. 9 is a schematic cross-sectional view of a portion of a semiconductor device at an eighth-intermediate fabrication stage, according to an illustrative embodiment.
Figure 10:
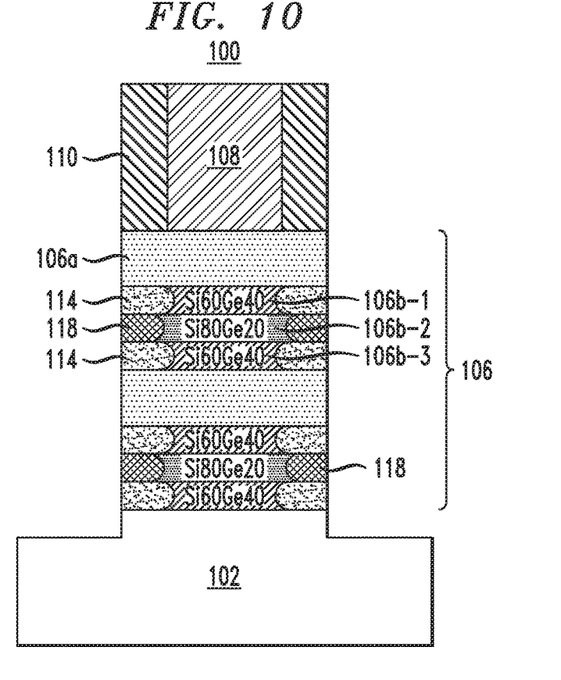
FIG. 10 is a schematic cross-sectional view of a portion of a semiconductor device, according to an illustrative embodiment.

FIG. 9 illustrates a cross-sectional view of semiconductor structure 100 at an eighth-intermediate fabrication stage. During this stage, dielectric layer 118 is selectively etched by an etch back process to remove the dielectric layer from the exterior surface of semiconductor 100 while leaving dielectric layer 118 in the space defined by divots 116a and 116b. In this exemplary embodiment, dielectric layer 118 is etched back to the level of the exterior surface of cladding spacer 110 and nanosheet 106a by, for example, an anisotropic etching process such as plasma etch or wet etching. As one skilled in the art would readily understand, the etch back process can be difficult to control with precision. Accordingly, FIGS. 3-8 show the etching step to form the divots discussed above in a planarized manner. However, as illustrated in FIG. 10, the etching step to form the divots discussed above can also be in curved manner.

Figure 11:
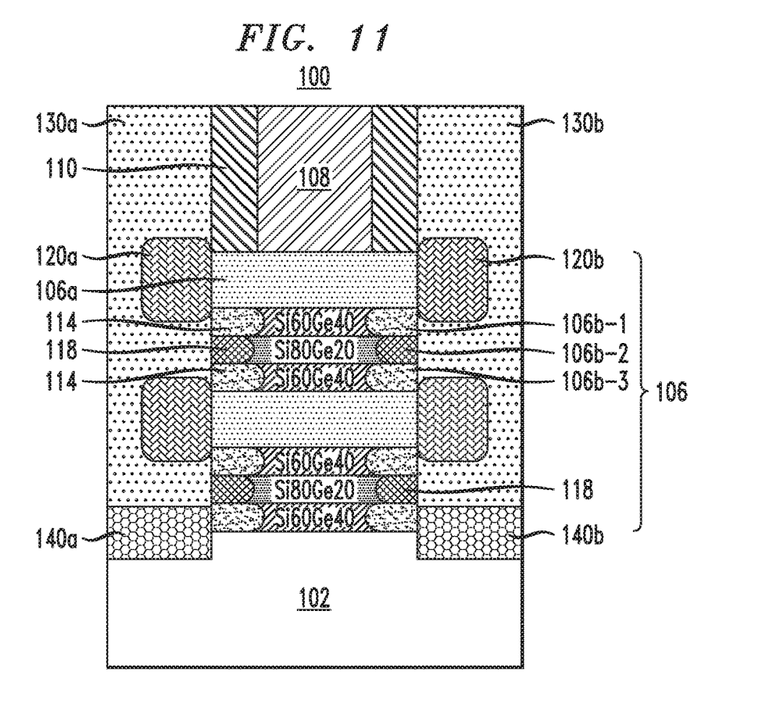
FIG. 11 is a schematic cross-sectional view of a portion of a semiconductor device at a ninth-intermediate fabrication stage, according to an illustrative embodiment.

FIG. 11 illustrates semiconductor structure 100 at a ninth-intermediate fabrication stage. During this stage, source/drain region 120a and 120b and interlayer dielectric (ILD) 130a and 130b are formed. In one embodiment, source/drain regions 120a and 120b are formed by growing respective epitaxial layers at the end of the end of nanosheet layers 106a. The source/drain region 120a and 120b can be doped by any suitable doping technique, including but not limited to, ion implantation, gas phase doping, plasma doping, plasma immersion ion implantation, cluster doping, infusion doping, liquid phase doping, solid phase doping, etc. In some embodiments, dopants are incorporated into the source/drain region 120a and 120b by in-situ doping during epitaxial growth of the source/drain region 120a and 120b.

In addition, dielectric isolation regions 140a and 140b are formed on base 102. Any method for forming ILDs, source/drain regions and dielectric isolation regions may be implemented in accordance with the embodiments described herein. FIGS. 12A-12D illustrate semiconductor structure 100 at a tenth-intermediate fabrication stage. In general, the replacement metal gate is formed by removing dummy gate 108, removing the multilayered sacrificial layers 106b, and depositing gate dielectric 160, and depositing metal gate 162. The dummy gate 108 and multilayered sacrificial layers 106b can be removed using a RIE process, for example, to form a void in the gate region The gate dielectric 160 is generally a thin film and can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. Gate dielectric 160 can be deposited by CVD, ALD, or any other suitable technique. Metal gate 162 can include any known metal gate material known to one skilled in the art, e.g., tantalum (Ta) and tantalum nitride (TaN). Metal gate 162 may be formed via known deposition techniques, such as atomic layer deposition, chemical vapor deposition, or physical vapor deposition. It should be appreciated that a chemical mechanical planarization (CMP) process can be applied to the top surface.

Figure 12A:
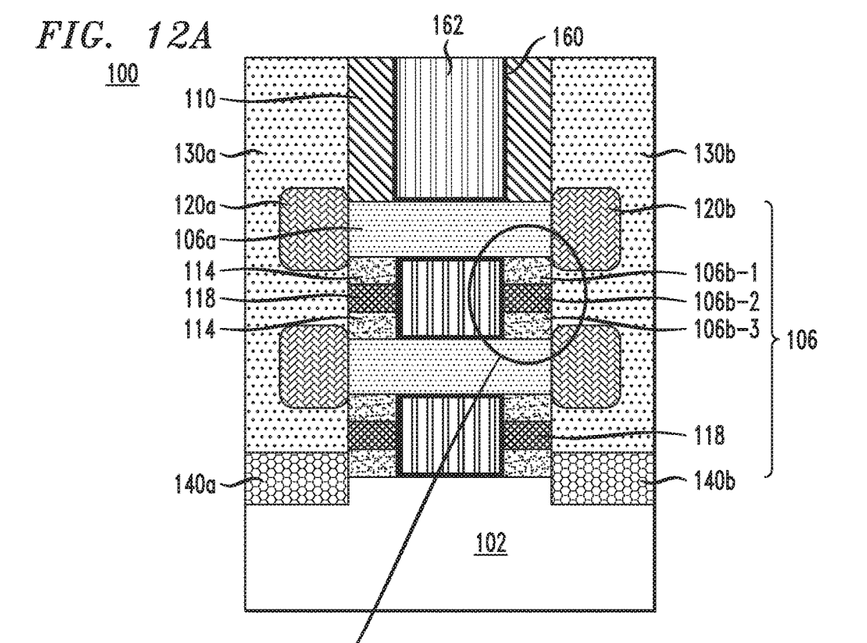
FIG. 12A is a schematic cross-sectional view of a portion of a semiconductor device at a tenth-intermediate fabrication stage, according to an illustrative embodiment.
Figure 12B:
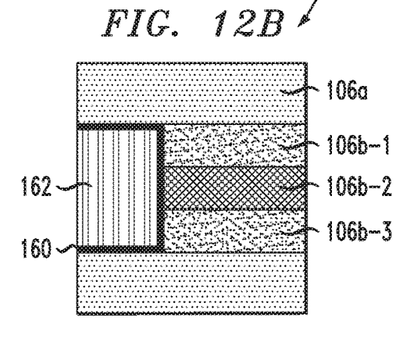
FIG. 12B is a schematic cross-sectional view of a portion of a semiconductor device at a tenth-intermediate fabrication stage, according to an illustrative embodiment.
Figure 12C:
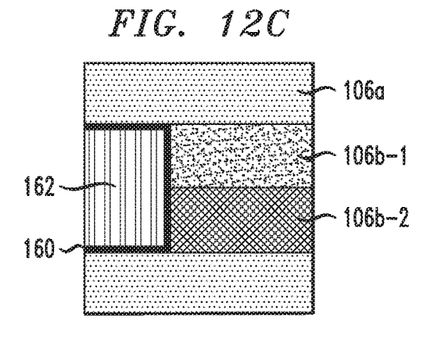
FIG. 12C is a schematic cross-sectional view of a portion of a semiconductor device at a tenth-intermediate fabrication stage, according to an illustrative embodiment.
Figure 12D:
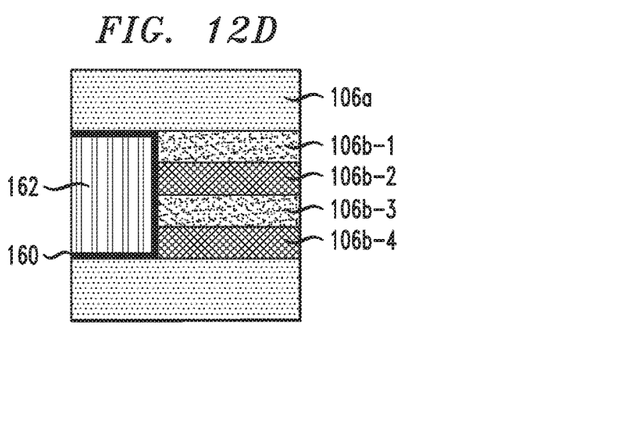
FIG. 12D is a schematic cross-sectional view of a portion of a semiconductor device at a tenth-intermediate fabrication stage, according to an illustrative embodiment.

Additionally, the replacement metal gate can be comprised of work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). During this stage, multilayered nanosheet 106b is etched to release the nanosheet channels thereby leaving for inner spacer 1, i.e., nanosheet 106b-1 and 106b-3, and inner spacer 2, i.e., 106b-2 as exemplified in FIGS. 12A and 12B, with gate 160 with thin dielectric 162. Alternative embodiments for inner spacer 1, i.e., nanosheet 106b-1 and inner spacer 2, i.e., 106b-2, are shown in FIG. 12C for a two tiered multilayered nanosheet 106b, and inner spacer 1, i.e., nanosheet 106b-1 and 106b-3, and inner spacer 2, i.e., 106b-2 and 106b-4, are shown in FIG. 12D for a four tiered multilayered nanosheet 106b.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure comprising:
   a nanosheet stack structure disposed on a base, wherein the nanosheet stack structure comprises:

a multilayered nanosheet between adjacent nanosheet layers, wherein the multilayered nanosheet comprises one or more first layers of a first material and one or more second layers of a second material, wherein the first material has an etch selectivity different than the second material;

wherein the one or more first layers of the multilayered nanosheet further comprise outer portions comprised of a third material;

wherein the one or more second layers of the multilayered nanosheet further comprise outer portions comprised of a fourth material and wherein the outer portions are inner spacers.

2. The semiconductor structure of claim 1, wherein the multilayered nanosheet is comprised of alternating layers of $Si_xGe_y$.

3. The semiconductor structure of claim 1, wherein the multilayered nanosheet comprises at least two layers.

4. The semiconductor structure of claim 1, wherein the adjacent nanosheet layers are silicon, and the multilayered nanosheet is comprised of alternating layers of $Si_xGe_y$.

5. The semiconductor structure of claim 4, wherein the multilayered nanosheet is comprised of $Si_{60}Ge_{40}/Si_{80}Ge_{20}/Si_{60}Ge_{40}$ layers.

6. The semiconductor structure of claim 1, wherein the first layer is of a first length and the second layer is of a second length, wherein the first length is less than the second length.

7. The semiconductor structure of claim 1, wherein the third material and the fourth material are the same or different material.

8. The semiconductor structure of claim 1, further comprising a cladding spacer and a metal gate disposed around the nanosheet stack structure.

9. A semiconductor device comprising:
a nanosheet stack structure disposed on a base, wherein the nanosheet stack structure comprises:
a first set of inner spacers disposed between the base and a first nanosheet layer, wherein the first set of inner spacers define a first opening therebetween;
a second set of inner spacers disposed between the first nanosheet layer and a second nanosheet layer, wherein the second set of inner spacers define a second opening therebetween; and
a replacement metal gate disposed in the first opening and the second opening and on a top surface of the second nanosheet layer.

10. The semiconductor device of claim 9, wherein the replacement metal gate disposed on the top surface of the second nanosheet layer further comprises a cladding spacer on each sidewall.

11. The semiconductor device of claim 9, wherein the replacement metal gate further comprising a gate dielectric layer and a metal gate.

12. The semiconductor device of claim 9, further comprising a source/drain region disposed on at least sidewalls of the first nanosheet layer and the second nanosheet layer.

13. The semiconductor device of claim 12, further comprising:
an isolation layer disposed on a top surface of the base adjacent to the nanosheet stack structure; and
an interlayer dielectric disposed on the isolation layer and sidewalls of nanosheet stack structure and the source/drain region.

14. The semiconductor device of claim 9, wherein the base comprises a semiconductor substrate.

15. The semiconductor device of claim 9, wherein the first set of inner spacers and the second set of inner spacers each comprises at least two inner spacers.

16. The semiconductor device of claim 9, wherein the first nanosheet layer and the second nanosheet layer each comprise silicon.

17. An integrated circuit comprising:
one or more semiconductor devices, wherein at least one of the semiconductor devices comprises:
a nanosheet stack structure disposed on a base, wherein the nanosheet stack structure comprises:
a first set of inner spacers disposed between the base and a first nanosheet layer, wherein the first set of inner spacers define a first opening therebetween;
a second set of inner spacers disposed between the first nanosheet layer and a second nanosheet layer, wherein the second set of inner spacers define a second opening therebetween; and
a replacement metal gate disposed in the first opening and the second opening and on a top surface of the second nanosheet layer.

18. The integrated circuit of claim 17, wherein the replacement metal gate further comprising a gate dielectric layer and a metal gate.

19. The integrated circuit of claim 17, further comprising a source/drain region disposed on at least sidewalls of the first nanosheet layer and the second nanosheet layer.

20. The integrated circuit of claim 19, further comprising:
an isolation layer disposed on a top surface of the base adjacent to the nanosheet stack structure; and
an interlayer dielectric disposed on the isolation layer and sidewalls of nanosheet stack structure and the source/drain region.

* * * * *